US006809871B2

(12) United States Patent
Heller et al.

(10) Patent No.: US 6,809,871 B2
(45) Date of Patent: Oct. 26, 2004

(54) GEOMETRIC BEAMSPLITTER AND METHOD FOR ITS FABRICATION

(75) Inventors: Matthias Heller, Hohenahr (DE); Werner Kress, Wetzlar (DE); Matthias Kuhn, Moegglingen (DE); Stefan Weissenrieder, Aalen (DE)

(73) Assignee: Carl Zeiss Semiconductor Manufacturing Technologies AG, Oberkochen (DE)

( * ) Notice: Subject to any disclaimer, the term of this patent is extended or adjusted under 35 U.S.C. 154(b) by 149 days.

(21) Appl. No.: 10/196,226

(22) Filed: Jul. 17, 2002

(65) Prior Publication Data

US 2003/0026001 A1 Feb. 6, 2003

(30) Foreign Application Priority Data

Jul. 17, 2001 (DE) ........................................ 101 36 507

(51) Int. Cl.[7] ........................... G02B 27/10; B23K 26/00
(52) U.S. Cl. ................. 359/629; 219/121.6; 219/121.85
(58) Field of Search ................................ 359/618, 627, 359/629; 219/121.6, 121.61, 121.67, 121.68, 121.69, 121.7, 121.71, 121.72, 121.73, 121.74, 121.75

(56) References Cited

U.S. PATENT DOCUMENTS

| 1,253,138 | A |   | 1/1918  | Brewster              |
|-----------|---|---|---------|-----------------------|
| 4,714,308 | A |   | 12/1987 | Sawamura et al.       |
| 4,856,019 | A |   | 8/1989  | Miyata et al.         |
| 4,957,604 | A |   | 9/1990  | Steininger            |
| 5,302,259 | A | * | 4/1994  | Birngruber ... 250/526 |
| 5,367,143 | A | * | 11/1994 | White, Jr. ... 219/121.68 |
| 5,850,309 | A |   | 12/1998 | Shirai et al.         |
| 6,028,660 | A |   | 2/2000  | Van Der Laan et al.   |
| 2003/0047544 | A1 | * | 3/2003 | De Steur et al. ... 219/121.71 |

FOREIGN PATENT DOCUMENTS

| DE | 38 02 998 A1  | 8/1989  |           |
|----|---------------|---------|-----------|
| DE | 38 03 014 A1  | 8/1989  |           |
| DE | 40 22 745 A1  | 1/1992  |           |
| DE | 44 37 896 C1  | 5/1996  |           |
| EP | 0 280 299 A2  | 8/1988  |           |
| EP | 0 435 468 B1  | 1/1996  |           |
| EP | 0 939 467 A2  | 9/1999  |           |
| EP | 1278094 A2 *  | 1/2003  | G02B/27/10 |
| JP | 63192010 A    | 8/1988  |           |
| JP | 63 107082 A   | 12/1988 |           |
| WO | WO 97/31298 A1 | 8/1997 |           |
| WO | WO 97/44155 A1 | 11/1997 |           |

OTHER PUBLICATIONS

M. Lapczyna et al, "Ultra High Repetition Rate (133 MHz) Laser Ablation of Aluminum with 1.2–PS Pulses", Applied Physics A 69., (Suppl.) Springer–Verlag 1999, pp. 883–886, Germany.

* cited by examiner

Primary Examiner—Ricky Mack
(74) Attorney, Agent, or Firm—Sughrue Mion, PLLC

(57) ABSTRACT

A method for fabricating a geometric beamsplitter involves applying a reflective coating having at least one metallic layer to a transparent substrate. A pattern of holes containing numerous holes that are preferably randomly distributed over its reflective surface is created in the reflective coating using laser processing. The method allows inexpensively fabricating beamsplitters that have accurately defined transmittances. Beamsplitters in accordance with the invention are suitable for use as dosimetry mirrors on, for example, the illumination systems of microlithographic projection exposure systems.

28 Claims, 3 Drawing Sheets

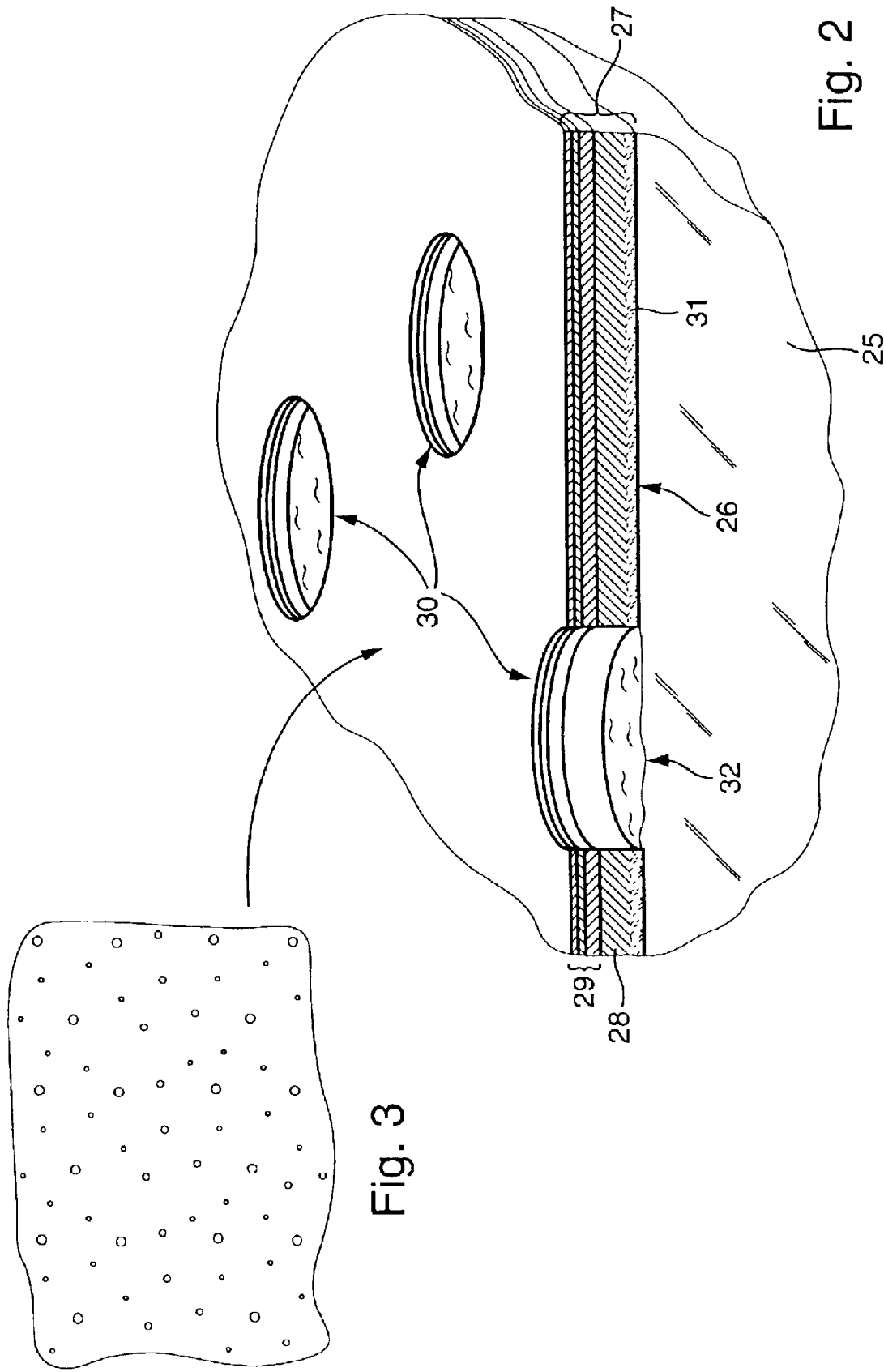

GEOMETRIC BEAMSPLITTER AND METHOD FOR ITS FABRICATION

The following disclosure is based on German Patent Application No. DE 101 36 507.1 filed on Jul. 17, 2001, which is incorporated into this application by reference.

BACKGROUND OF THE INVENTION

1. Field of the Invention

The invention relates to a method for fabricating a geometric beamsplitter, a beamsplitter that may be fabricated employing that method, and an illumination system equipped with a beamsplitter of that type for use on an optical device, in particular, on a microlithographic projection exposure system.

2. Description of the Related Art

Numerous application areas of optics require splitting a light beam into two equal, or unequal, partial beams. Beamsplitters that are configured either as a geometric beamsplitter or a physical beamsplitter are employed for that purpose. While physical beamsplitters leave the cross-sectional areas of light beams unaltered, geometric beamsplitters split their cross-sectional areas into partial beams using, for example, a reflective surface that has openings.

In many applications, an effort is made to accurately determine, for example, in the case of so-called "dosimetry mirrors," such as those employed on the illumination systems of optical devices, the relation between the reflected energy and the energy transmitted through those openings.

As an example, U.S. Pat. No. 6,028,660 discloses an illumination system equipped with a dosimetry device for use on a microlithographic projection exposure system for fabricating semiconductor devices and other types of microdevices. Systems of that type, which may be configured as wafer scanners or wafer steppers, are used for projecting patterns on photomasks (reticles) or ruled plates onto an object, for example, a semiconductor wafer, coated with a light-sensitive film, at high spatial resolutions. In order to obtain a well-defined pattern on the substrate, the substrate should be irradiated with an accurately determined quantity of energy, or dose. It is thus essential to determine the actual irradiation dose in order to allow accurately setting the necessary dose whenever necessary using a feedback device that controls the luminous output of the light source. Between its light source and its light exit, the illumination system has an output-coupling device for coupling out a fraction of the luminous energy from its light source toward an energy sensor whose energy measurements may be employed for controlling its light source, where it is essential to know the absolute transmittance of the beamsplitter in order to allow drawing conclusions regarding the absolute intensity of the light source based on the energy sensor's energy measurements, which is necessary in the case of, for example, wafer steppers, in order to be able to accurately set the open periods of their shutters or the durations of the illumination periods for exposures. In the case of wafer scanners, it is essential that illumination doses be uniform over any given illuminated field.

There is thus need for beamsplitters that have accurately defined transmittances. These should be simple and inexpensive to fabricate.

SUMMARY OF THE INVENTION

One object of the invention is to provide a method for fabricating a geometric beamsplitter that will allow inexpensively fabricating geometric beamsplitters having accurately defined transmittances. It is another object of the invention to provide a geometric beamsplitter having an accurately definable transmittance that may be inexpensively fabricated in large numbers.

As a solution to these and other objects, the invention, according to one formulation, provides a method for fabricating a geometric beamsplitter comprising: coating a surface of a substrate consisting of a transparent material with a reflective coating that contains at least one metallic layer; creating a pattern of holes comprising a large number of transparent holes in the reflective coating; wherein the holes of the pattern of holes are created by laser processing.

In the case of the method according to the invention, a surface of a substrate consisting of a transparent material is initially coated with a reflective coating that contains at least one metallic layer whose thickness is preferably chosen such that it is substantially opaque to the light to be employed. A pattern of holes having a large number of transparent holes whose number, size, and/or distribution largely determines the beamsplitter's transmittance is then created in that reflective coating. In accordance with the invention, those holes are created using laser processing, whereby the reflective coating is simultaneously or repeatedly irradiated at numerous locations with laser light having a suitable diameter and a suitable wavelength, energy, and duration such that transparent holes in the reflective coating arise, without destroying the substrate or areas of the reflective coating bordering on irradiated sections. The total transmittance is set mainly by varying the total number of holes and their average area.

The method is suitable for use on all types of reflective coatings that have absorptions at the laser wavelength employed for creating the pattern of holes that are sufficiently high to allow removing the reflective coating, largely via evaporation. As used here, the term "metallic layer" stands for, in general, layers of materials that absorb the light employed strongly enough to allow their evaporation. Such materials are not necessarily metallic. Compared to wet-chemical etching methods, under which patterns of holes may be created employing a photolithographic process involving coating, exposure, and subsequent etching, which may also be employed, dry laser creation of patterns of holes has the advantage that it causes no chemical changes and leaves no contaminants on the reflective surface. The method, which works both in a vacuum and in air, thus imposes no special requirements on the working environment and allows inexpensively, rapidly, fabricating geometric beamsplitters having well-defined transmittances.

A pulsed laser is preferably employed for creating the holes. It has proven beneficial to employ a first laser pulse, and at least a second laser pulse, for irradiating a given area, where the laser energy is set such that the first laser pulse largely creates a hole in the coating and the second cleans up the hole in order to smooth and even out its edges. It has been found that it will be sufficient if the laser pulses have substantially the same power density and duration, which means that no special requirements are imposed on controlling the laser during laser processing and that the method may be performed less expensively than, for example, known methods for creating blind and through holes in multilayer structures for multichip modules (WO 97/44155).

It is possible to create a regular hole pattern in the form of, for example, a two-dimensional grid. However, another preferred embodiment foresees that a pattern of holes having a random distribution of holes, i.e., a pattern other than a grid, where the spatial coordinates of individual holes are generated by a random number generator, is created. All holes will preferably be randomly distributed. However, both a group of randomly distributed holes and a group of regularly distributed holes may also be provided.

Random hole distributions yield significant benefits, both during fabrication and when beamsplitters are employed. When beamsplitters are employed, i.e., when large areas of their reflective surfaces are illuminated, diffractive effects and interference effects in the transmitted light, such as those that occur in the case of patterns of transmitting holes having regular grid layouts, are precluded. Moreover, random patterns of holes may be particularly simply reprocessed to yield other random patterns of holes having greater total transmittances by creating additional (randomly distributed) holes. In the following, we shall explain how random patterns of holes may be employed for fabricating beamsplitters having accurately prescribed transmittances with high yields.

According to one embodiment of the method, in fabricating a beamsplitter having a prescribed nominal transmittance, a distribution of holes that will intentionally yield a transmittance that is less, for example, 10%–20% less, than the beamsplitter's nominal transmittance, is initially created under controlled conditions. Although the initial hole distribution created during this initial step may be regular, it should preferably be a random distribution of holes. A measurement of the beamsplitter's transmittance is then conducted in order to determine its current transmittance. Additional, preferably irregularly or randomly distributed, holes are then created, controlled by its nominal transmittance, in order to increase its transmittance to the desired nominal transmittance, i.e., a multistage process in which its transmittance is increased in steps until it reaches the desired nominal value, is conducted, where the steps involved in measuring its current transmittance and then creating additional holes may, if necessary, be repeated in order to gradually increase its actual transmittance to its nominal transmittance. This approach allows attaining high yields of "good" beamsplitters, since accidental fabrication of beamsplitters having excessive transmittances is reliably avoided.

Although additional holes may be created employing the trial-and-error method, the number of additional holes remaining to be created is preferably computed, based on the difference between the beamsplitter's nominal transmittance and its current transmittance, in order to allow adding a precomputed number of additional holes that will allow reaching the nominal transmittance in a single step with high accuracy. In one embodiment of the method, an in-situ measurement of transmittance is conducted while holes are being created in the reflective surface. The creation of additional holes may then be based on the results of that measurement, which will allow confining the accuracy with which transmittance may be set to the contribution to transmittance of a single hole.

Holes created in accordance with the invention preferably have an average diameter ranging from about 30 $\mu$m to about 100 $\mu$m, in particular, ranging from about 40 $\mu$m to about 60 $\mu$m, and average interhole spacings ranging from about 0.5 mm to about 1 mm. Particularly in the case of beamsplitters destined for the preferred use on the illumination systems of microlithographic projection systems, low transmittances of less than about 5% are preferable in order that most of the light available may be employed for achieving high throughputs of exposed substrates. In practice, transmittances should be less than 3%; in particular, they should be around 1%. Accuracies of better than 30% of nominal absolute transmittances may be regularly attained.

Any suitable metallic material, either a pure metal or an alloy, may be employed for fabricating the at least one metallic layer, provided that its reflectance for the electromagnetic radiation to be employed in actual operation is sufficiently high. Aluminum is preferred in the case of the preferred application of dosimetry mirrors on illumination systems for use on microlithographic systems operating in the ultraviolet, since its reflectance over the relevant angles of incidence, which range from about 30° to about 60°, is largely independent of the angle at which radiation is incident on it. Although the thicknesses of this layer may, for example, range from about 50 nm to about 100 nm, they are not confined to that range.

Good high-reflectance coatings based on aluminum may be evaporatively deposited at low ambient pressures and high evaporation rates employing, for example, flash evaporation. However, reproducibly providing ideal processing conditions during production requires a lot of expensive equipment and effort. A preferred embodiment of a method for fabricating a reflective layer in accordance with the invention foresees that the material of the metallic layer, i.e., in particular, aluminum, is evaporated at a gradually increasing rate, where relatively low evaporation rates are employed when evaporation commences. The evaporation rate is then gradually, preferably linearly, increased to high levels. This approach allows depositing high-quality reflective coatings, particularly in the case of aluminum, without need for a lot of expensive equipment and expenditure of a lot of effort. Under this embodiment of the method, the material to be evaporated, in particular, aluminum, is initially employed as a sort of getter pump in order to arrive at a low pressure in the coating system's coating chamber. The low evaporation rates initially employed should be set to suit this employment. Largely uncontaminated aluminum, which forms the reflective surface, is then evaporated at high rates in this purified atmosphere. This embodiment involving an increasing evaporation rate may be beneficially employed in depositing all types of reflective coatings, even when no patterns of holes are to be created in them.

Although the reflective coating may be confined to a single metallic layer, an overcoating having at least one layer of dielectric material should preferably deposited onto the metallic layer. Although this overcoating may largely have a protective function, it is preferably designed to be a reflectance-enhancing overcoating. The metallic layer should preferably be overcoated with a multilayer coating having several alternating layers of high/low-refractive-index materials. Reflective coatings of this type are known from, for example, European Patent 0 280 299, which corresponds to U.S. Pat. No. 4,856,019, U.S. Pat. No. 4,714,308, European Patent 0 939 467, or U.S. Pat. No. 5,850,309. Any of the multilayer coatings described therein are, in principle, suitable for fabricating beamsplitters in accordance with the invention. Their associated characteristics are thus herewith made a part of this description by way of reference thereto.

Preferred multilayer coatings for use as reflective coatings on beamsplitters in accordance with the invention will be described in greater detail in conjunction with the discussion of sample applications. Of course, they may also be employed for fabricating high-reflectance mirrors for ultraviolet light having wavelengths ranging from about 193 nm to about 365 nm, regardless of whether they have had any patterns of holes applied to them.

The aforementioned and other characteristics of the invention are as stated in the accompanying claims, description, and figures, where those individual characteristics thereof depicted may represent themselves alone or several such in the form of combinations of subsets thereof that appear in an embodiment of the invention and have been implemented in other fields, as well as beneficial embodiments that may be themselves inherently patentable.

BRIEF DESCRIPTION OF THE DRAWINGS

FIG. 2 is a schematized representation of a section through an embodiment of a beamsplitter in accordance with the invention;

FIG. 3 is a schematized representation of a top view of a preferred embodiment of a beamsplitter according to the invention;

DETAILED DESCRIPTION OF THE PREFERRED EMBODIMENTS

Figure 1:
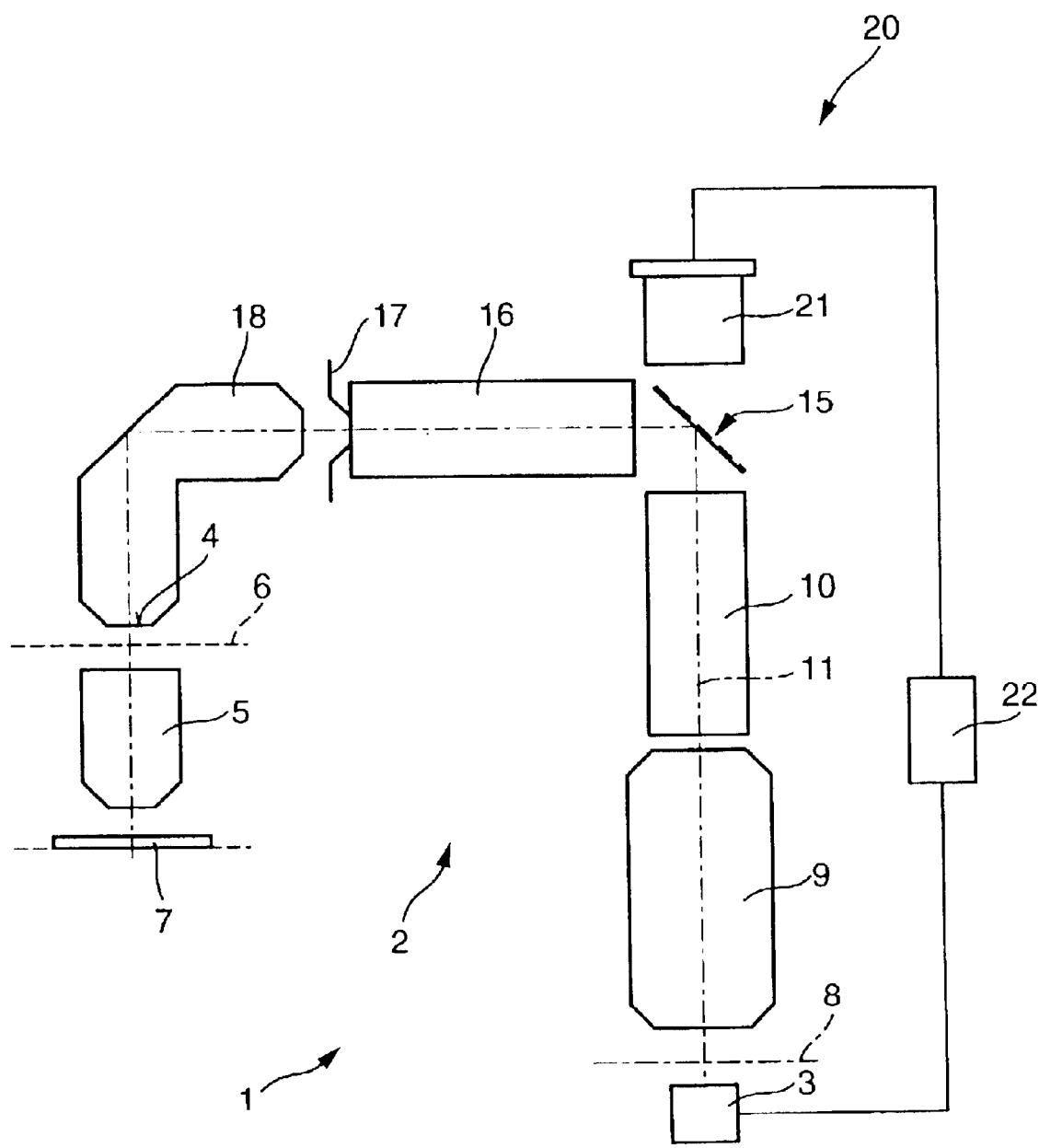
FIG. 1 is a schematized representation of a microlithographic projection exposure system equipped with an illumination system incorporating a beamsplitter in accordance with the invention.

FIG. 1 depicts an example of a projection exposure system 1 for fabricating integrated circuits or other microdevices at spatial resolutions as fine as fractions of 1 $\mu$m. This system consists of an illumination system 2 that has a light source 3 and a light exit 4, and is used for uniformly illuminating, over a sharply delimited area, a mask 6 arranged in the object plane of a projection lens 5 in a manner adapted to suit to the optical characteristics of the projection lens 5. The projection lens 5 images the pattern on the reticle 6 onto the image plane of the projection lens, in which a substrate in the form of a semiconductor wafer 7 coated with a photosensitive layer (photoresist) resides.

A laser, for example, a standard excimer laser operating in the deep ultraviolet (DUV) spectral region at wavelengths of 248 nm, 193 nm, or 157 nm, may serve as the light source 3 of the illumination system 2. However, the light source might also be a mercury-vapor lamp operating at 365 nm equipped with an ellipsoidal mirror. The light beam supplied by the light source passes through a shutter 8 and enters a lens system 9 that couples the radiation into a light integrator 10 in the form of a rod fabricated from a transparent material that follows the lens system in the optical train. Within this light integrator 10, which is also termed a light-mixing element, light is mixed via multiple internal reflections and exits the light integrator largely homogenized.

Arranged beyond the exit face of the light integrator and inclined at an angle of 45° to the optical axis 11 is an embodiment of a beamsplitter 15 according to the invention that serves as a deflecting mirror that deflects light exiting the light integrator 10 through 90° toward another rod-shaped light integrator 16 that has an internal reticle-masking device (REMA) 17 on its exit. An optical system 18 equipped with a deflecting mirror then images the REMA onto the object plane of the projection lens 5, in which the reticle 6 is arranged.

In the case of microlithographic projection exposure systems of this type, it is essential that the irradiation incident on the photosensitive layer on the substrate 7 be accurately known and, if necessary, be adjusted to a predetermined level. That task is handled by an irradiation-measurement system 20 comprising a photosensitive energy detector 21 incorporated into the illumination system 2 that is arranged in the extension of the optical axis 11, following the beamsplitter 15, such that a certain portion of the light coming from the light source 3 falls on the sensor 21 after exiting the beamsplitter 15. The sensor is connected to a controller 22 that will allow controlling the output power of the light source 3, based on the luminous energy measured by the sensor 21. It may be seen that accurate knowledge of the transmittance of the partially transmitting deflecting mirror 15 is essential to accurately controlling the absolute value of the irradiation incident on the substrate 7.

The design of the geometric beamsplitter 15 will now be described in greater detail, based on FIGS. 2 and 3. This beamsplitter 15, which serves as a dosimetry mirror, has a substrate 25 fabricated from a material, in particular, synthetic quartz glass or calcium fluoride, that is transparent to the light employed. This substrate may be in the form of, e.g., a plane-parallel plate, or in the form of a prism. A thin reflective coating 27 is applied to a planar surface 26 of this substrate employing an evaporative process. This reflective coating essentially consists of a metallic layer 28 of aluminum evaporated directly onto the substrate 25 and a dielectric, reflectance-enhancing coating 29 configured in the form of a multilayer coating having several layers of alternately high/low-refractive-index dielectric materials evaporated onto the layer of aluminum.

A special characteristic thereof is that the aluminum is initially evaporated at a low rate that is subsequently gradually linearly ramped up. A property of aluminum vapor that contributes to low reflectances in the ultraviolet, namely, its partial oxidation, can, at low evaporation rates, also capture disturbing residual gas molecules, thereby generating a pumping effect. A high-quality, high-reflectance, film of, for example, largely unoxidized aluminum, in the outermost molecular layers of the metallic layer, which are deposited at relatively high evaporation rates, is then obtained, once residual contaminants have been "pumped off" and deposited in the lower portions of the metallic layer. In the case of a front-surface mirror, only these outermost layers contribute to its reflectance, since the penetration depth of reflected radiation is only a few nanometers in the case of the preferred applications in the ultraviolet spectral region. Metallic layers in accordance with the invention, in particular, layers of aluminum, may, if deemed necessary, be recognized by their purity gradients orthogonal to the layers, where oxide inclusions 31 may occur close to the substrate and the metallic material near their reflecting surfaces is virtually uncontaminated.

The reflective coating 27 is designed such that it is substantially opaque to incident light, which is due to both the adequate thickness of its aluminum layer, which might, for example, range from 50 nm to 100 nm, and the reflectance of its multilayer dielectric coating 28, which is due to interference effects. In order to set an accurately defined transmittance of the beamsplitter, the reflective coating is perforated at numerous locations by small holes 30 that are randomly distributed (cf. FIG. 3) over its reflective surface. For example, in order to set a transmittance falling within the range 0.5% to 1.5%, holes having typical average diameters ranging from about 40 $\mu$m to about 60 $\mu$m whose average separations range from about 0.5 mm to about 1 mm will need to be provided.

Once the reflective coating 27 has been deposited, this pattern of holes is created using laser processing employing a pulsed (Nd:YAG) laser emitting at a wavelength of 1,064 nm. Several pulses are employed for creating each hole, where the first pulse essentially creates the hole, and the second pulse that follows it frees the hole from residues left behind by the first pulse. Since the coating material, in particular, the material of the metallic layer 28, has sufficiently high absorption at the laser wavelength chosen, for sufficiently high pulse energies, the coating material will be vaporized over a roughly circular zone having well-defined dimensions. In the case of this particular process, the surface 26 of the substrate will usually become slightly roughened in the region of the base 32 of each hole, which will cause a beneficial light-scattering effect in the region of holes.

Laser processing creates holes whose individual transmittances exhibit a certain amount of scatter due to unavoidable variations in their diameters, which makes accurately setting the beamsplitter's total transmittance difficult whenever a precomputed number of holes has been created in a single run. The pattern of holes should thus be preferably created in several stages, where, for example, a transmittance set value or setpoint, $T_{SET}$, that is much less than the desired total transmittance, for example, 80% of the desired total transmittance, might be set in an initial stage. The actual transmittance, $T_{ACT}$, obtained from this initial stage is then measured and compared to the desired final transmittance. The number of holes remaining to be created is then computed from the difference and then created in the reflective coating. Since only comparatively few holes will have to be created in this second stage, the maximum transmittance error resulting from this second stage will be relatively low, i.e., the desired absolute value of final transmittance, for example, 1%, may be set to within a low tolerance of, for example, 15%, employing a two-stage process, as will be explained in greater detail in the following section, based on an example.

In the case of the aforementioned creation of a pattern of holes employing a pulsed YAG-laser, transmittance reproducibilities of, for example, about ±17% of an absolute value, are attainable. Due to this large scatter, single-stage processes produce acceptable, but low, yields of good beamsplitters, since some beamsplitters will have transmittances falling outside specified tolerances. However, yields of good beamsplitters may be significantly improved by employing a multistage process, without need for making any changes in the relatively inexpensive laser equipment. Based on the reproducibility of beamsplitter transmittance (±17%), one might, for example, attempt to obtain a transmittance of 0.83% from the first stage in order that virtually no beamsplitters will have transmittances exceeding the desired final transmittance following the first stage. Once the transmittances obtained from the first stage have been measured, the number, k, of additional holes that need to be created may be computed from $$k=4*(T_{SET}-T_{ACT})*x*y/(D^2*\pi*t),$$

where x and y are the edge lengths of a rectangular surface to be perforated and D is the diameter of a hole having transmittance t.

This stepwise correction of the number of holes needed may be terminated by in-situ transmittance measurements with a tolerance of a single hole. The best attainable transmittance reproducibility is thus limited only by the transmittance of a single hole. If one needs, for example, 52,000 60-μm-diameter holes in order to arrive at a total transmittance of 1% for a field measuring 159 mm×100 mm, then the transmittance of each hole will contribute approximately 0.00002% to the total transmittance, which also represents the theoretical upper limit on reproducibility.

Since the total number of holes that will ultimately have to be created depends upon the results obtained from the first stage, a final hole pattern having a grid arrangement, i.e., a pattern consisting entirely of a regular array of holes, will be unattainable, which, among other reasons, is why a pattern differing from a grid arrangement that will have to be created such that the beamsplitter's transmittance will be virtually independent of location on its surface is preferable, which may be accomplished, for example, by using a pair of mutually independent random-number generators to generate pairs of spatial coordinates that will result in a pattern of holes randomly distributed over the beamsplitter's surface, as shown in FIG. 3. One major benefit of this approach is that the pattern of randomly distributed holes may be arbitrarily supplemented by adding more randomly distributed holes in order to set a desired final transmittance in small steps whenever necessary.

In the case of one embodiment, the reflective coating 27 has a high reflectance, R, typically in excess of about 95%, over a broad range of angles of incidence of around 45°±12°. This virtual independence of its reflectance on the incidence angle helps preserve the telecentricity of the illumination system, where it will be beneficial to employ aluminum, whose spectral reflectance is largely independent of the angle of incidence over a broad range of angles of incidence, for the metallic layer 28. If necessary, the aluminum layer may form the coating's outer, reflective, layer. However, it will be preferable to employ the arrangement of a dielectric reflection-enhancing coating 29 schematically depicted in FIG. 2, which will allow attaining high reflectances over a broad range of angles of incidence.

An example of a preferred embodiment of a reflective coating has a multilayer dielectric coating consisting of alternating layers of a high-refractive-index material (H) and a comparatively low-refractive-index material (L) applied to its aluminum layer and is characterized by a small number of layers and a spectrally broad stopband, i.e., a high reflectance over a broad range of wavelengths about its operating wavelength, λ. The basic coating design may be characterized using the following condensed notation:
Al||a*0.25L|(0.25H|0.25L)$^x$|0.75H|0.25L|0.5H|.

In this notation, "Al" designates the aluminum layer, a vertical bar (|) designates an interface between layers, and "0.25L" designates the thickness of a layer of low-refractive-index material, expressed as a fraction of the coating's operating wavelength, i.e., in this case, a λ/4-layer. The factor a is roughly equal to 1, and preferably has a value slightly less than 1, for example, a value between 0.8 and 1. The exponent x designates the number of times a pair of λ/4-layers of high/low-refractive-index materials is repeated, and will preferably have the value x=2.

A special feature of this design is its final λ/2-layer of high-refractive-index material that is largely responsible for the broadening of its stopband via an achromatic effect. Other of its characteristics are its thick layer of high-refractive-index material with a thickness of ¾λ on top of the pairs of λ/4 layers. Actual layer thicknesses that differ somewhat from this basic design may be chosen in order to optimize its spectral-reflectance curve, R(λ), over the wavelength range of interest. A preferred design may thus be characterized as follows:
Al||0.19L|0.28H|0.25L|0.28H|0.25L|0.84H|0.26L|0.57H|.

Adjustment of these layer thicknesses to suit the 45° angle of reflection preferred here involves multiplying them by a factor of 1/cosφ', where φ' is the primary angle at which light transits the layer involved according to Snell's law. After adjustment to suit this primary angle of 45°, these layer thicknesses become:

Al|0.22L|0.30H|0.28L|0.30H|0.28L|0.89H|0.30L|0.60H|.

For an operating wavelength of λ=365 nm (the mercury i-line), we thus obtain the following physical layer thicknesses, expressed in units of nm:

Al|54.5L|57.0H|70.4L|57.8H|68.2L|170.2H|73.6L|14.8H|.

For an operating wavelength of λ>about 230 nm, i.e., in particular, for operating wavelengths of 248 run or 365 nm, hafnium oxide is preferentially employed as the high-refractive-index material and silicon dioxide is preferentially employed as the low-refractive-index material. Other materials may also be employed in the basic design appearing above if the thicknesses of the layers involved are adjusted to suit their refractive indices. The other types of other materials that might be employed are all oxides and fluorides whose absorptions are less than the reflectance enhancement of the multilayer stack. Nonabsorbing materials, such as $MgF_2$ in the case of the low-refractive index material or $LaF_3$ or $ThF_4$ in the case of the high-refractive-index material ($Ta_2O_5$ is also employed at 365 nm), are preferentially employed. The materials employed should ideally have high absorptions at the wavelength, e.g., 1,064 nm, employed for generating the pattern of holes.

Figure 4:
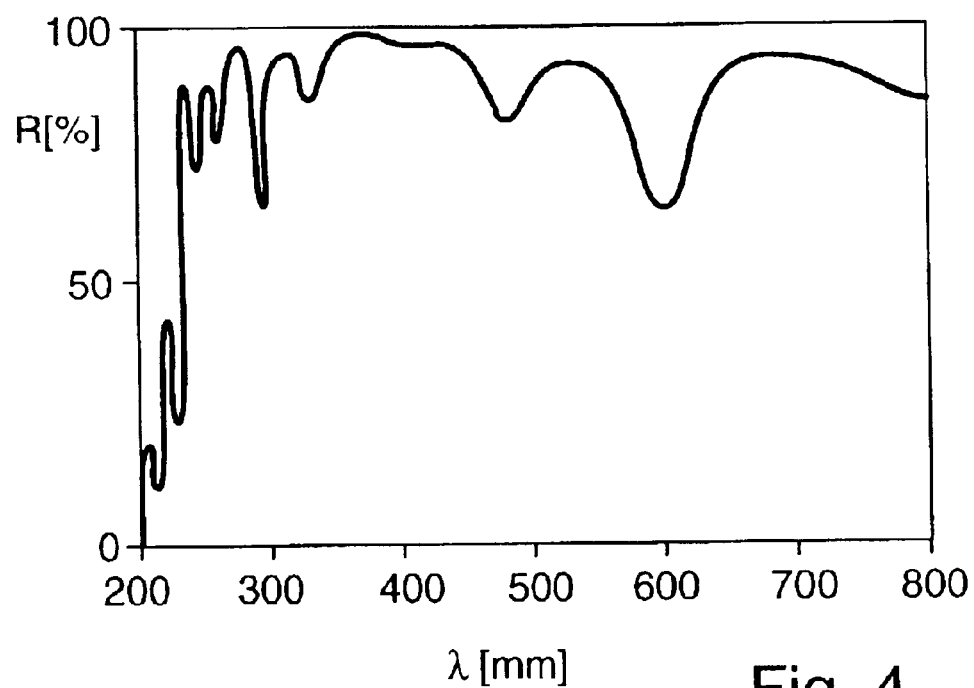
FIG. 4 is a plot of the reflectance of the reflective coating for use at 365 nm, which has a broad stopband, as a function of wavelength.
Figure 5:
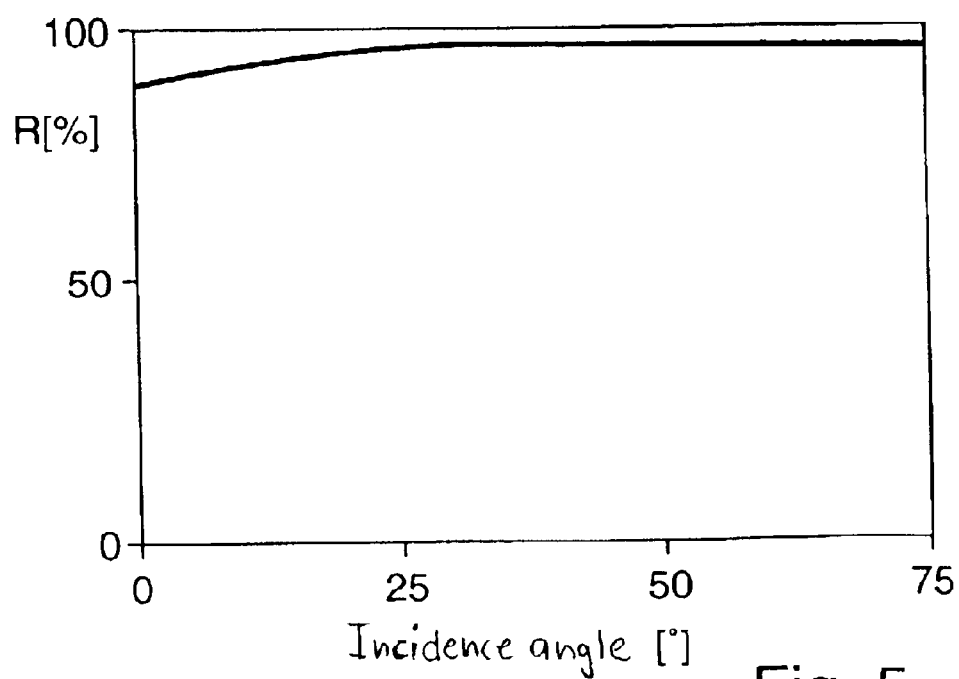
FIG. 5 is a plot of the reflectance of that coating as a function of angle of incidence for angles of incidence of around 45°.

Major optical characteristics of this design, namely, the coating's high reflectance, R, over a broad stopband about its operating wavelength, λ=365 nm, shown in FIG. 4 and weak dependence of this high reflectance on angle of incidence shown in FIG. 5, will be apparent from FIGS. 4 and 5.

A design employing alternating layers of hafnium oxide/silicon dioxide that has been optimized for an operating wavelength of 248 nm may be characterized as follows:

Al|51.5H|50.7L|32.7H|50.7L|32.7H|52.1L|18.3H|.

In this particular case, the first dielectric layer that follows the aluminum layer consists of a high-refractive-index material and the multilayer coating is terminated by a final layer of high-refractive-index material whose thickness is substantially less than λ/4.

A multilayer coating based on the same materials that has a high reflectance (>92%) over a wavelength range extending from about 230 nm to about 370 nm for the aforementioned range of angles of incidence may be characterized as follows:

Al|39.4L|36.3H|54.7L|36.3H|36.1L|8.2H|60.7L|28.6H|.

The following design may also be employed in order to maintain high coating reflectance (>92%) over that same range of angles of incidence:

Al|39.6L|36.2H|53.6L|37.3H|27.5L|15.1H|58.0L|37.2H|34.5L|11.2H|54.1L|90.0H|70.9L|.

Layer thicknesses may vary by as much as 5% from their respective, stated, optimal, values without significantly adversely affecting the optical properties of the multilayer films involved.

Multilayer coatings that employ fluorides as their low/high-refractive-index materials have proven their worth in the case of operating wavelengths, λ, much less than 230 nm, in particular for λ=193 nm. Particularly beneficial are multilayer coatings that employ magnesium fluoride ($MgF_2$) as their low-refractive-index material and thorium fluoride ($ThF_4$) as their high-refractive-index material.

It has been found that in order to attain high reflectances of about 89% or 90% over a broad range of angles of incidence (45°±12°), it will be sufficient to overcoat the aluminum layer with a single layer of high-refractive-index material, in particular, thorium fluoride, in which case the optimal layer thickness will be about 53 nm.

In the case of multilayer coatings involving alternating layers of $MgF_2/ThF_4$, higher reflectances may be attained for just a few layers, typically less than seven layers. A multilayer coating having a reflectance, R, exceeding 92%, may be characterized as follows:

Al|24.0L|36.1H|40.8L|36.1H|41.0L|34.0H|.

A multilayer coating consisting of just four alternating layers of $MgF_2/ThF_4$ that has a reflectance, R, exceeding 91% over the full range of angles of incidence in question may be characterized as follows:

Al|23.0L|36.1H|39.3L|36.4H|.

The dielectric material employed for the first layer of dielectric material deposited directly onto the aluminum layer may also be a high-refractive-index material. The following is an example of a design for a multilayer coating consisting of just five layers:

Al|54.7H|38.3L|36.3H|39.4L|30.0H|.

This multilayer coating is characterized by its particularly small total number of layers, which favorably affects the reflective coatings' abilities to withstand laser radiation in continuous-duty operation. Since these multilayer coatings are insensitive to variations in fabrication conditions, layer thicknesses that differ from those stated for the optimal designs by ±5% will have only minor effects on their optical properties.

Under some circumstances, it may also be desirable to employ a mirror that has a high reflectance over a very narrow range of angles of incidence only. In principle, mirrors of that type are narrow-band filters that are employable as such in optical trains. A multilayer coating designed for use at an operating wavelength of 193 nm that has a high reflectance, typically greater than 95%, over a very narrow range (45°±1°) of angles of incidence only may be characterized as follows;

Al|(0.25<d<0.5)H|(0.25L|0.25H)$^x$|0.5L|, where the thicknesses of the layers of high/low-refractive-index materials are here expressed in terms of fractions of the operating wavelength and d is a layer thickness, expressed in terms of fractions of the operating wavelength. Although the exponent, x, is preferably equal to 9, it may, in general, be an integer greater or less than nine. In the case of a preferred multilayer coating that employs thorium fluoride as its high-refractive-index material and magnesium fluoride as its low-refractive-index material, this particular design yields the following physical layer thicknesses:

Al|50.3H|(38.6L|33.3H)$^9$|77.2L|.

All those reflective coatings mentioned in conjunction with sample embodiments are particularly beneficially applicable in combination with patterns of holes created employing laser processing, i.e., are beneficially applicable to beamsplitters in accordance with the invention. Their multilayer coatings may, of course, also be beneficially employed on normal reflective coatings lacking patterns of holes.

The weak dependences of the reflectances of those coatings described above on the angles of incidence of incident radiation is beneficial in the sense that such coatings may also be beneficially employed on curved surfaces, for example, employed as reflective coatings on the imaging mirrors of catadioptric projection lenses for use in microlithography.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

What is claimed is:

1. A method for fabricating a geometric beamsplitter comprising:

coating a surface of a substrate consisting of a transparent material with a reflective coating that contains at least one metallic layer; and creating a pattern of holes comprising a large number of transparent boles in the reflective coating;

wherein the holes of the pattern of holes are created by laser processing.

2. A method according to claim 1, wherein a first laser pulse, and at least a second laser pulse, are employed for creating a hole, the laser pulses having substantially the same power density and duration.

3. A method according to claim 1, wherein a pattern of holes having a random distribution of holes is created.

4. A method according to claim 1, further comprising:

measuring a transmittance of the beamsplitter in order to determine an actual transmittance; and creating additional holes in order to increase the transmittance of the beamsplitter, depending upon the actual transmittance.

5. A method according to claim 4, wherein the additional holes are created according to a random distribution.

6. A method according to claim 4, wherein, subsequent to measuring the actual transmittance of the beamsplitter, a computation of the number of the additional holes to the added is performed, based on the difference between a nominal transmittance and the actual transmittance, wherein the creation of additional boles depends upon the result of the computation.

7. A method according to claim 1 comprising:

consecutively creating numerous holes;

measuring the transmittance of the beamsplitter while creating the holes, in order to determine the actual transmittance of the beam splitter; and terminating the creation of holes once the actual transmittance substantially equals the nominal transmittance;

wherein said measuring is an in situ measurement.

8. A method according to claim 7, wherein the numerous hales are created with a random distribution.

9. A method according to claim 1, wherein aluminum is deposited in order to create the metallic layer.

10. A method according to claim 1, wherein the material of the metallic layer is evaporated at an increasing rate in an evaporation atmosphere such that, in an initial phase, evaporation takes place at a rate that is chosen so low that evaporatively deposited material may act as a getter for residual contaminants present in the evaporating atmosphere.

11. A method according to claim 1, wherein, in creating the reflective coating, a dielectric coating consisting of at least one layer of dielectric material is deposited onto the metallic layer.

12. A method according to claim 11, wherein, in depositing the dielectric coating, a multilayer coating consisting of several layers of alternately high/low-refractive-index dielectric materials is applied.

13. A geometric beamsplitter comprising:

a substrate fabricated from a transparent material;

a reflective coating containing at least one metallic layer arranged on a surface of the substrate; and a pattern of holes comprising numerous transparent holes created in the reflective coating using laser processing.

14. A beamsplitter according to claim 13, wherein the pattern of holes has a random distribution of holes.

15. A beamsplitter according to claim 13, wherein the holes have at least one of an average diameter ranging from about 30 $\mu$m to about 100 $\mu$m and an average interhole separation ranging from about 0.5 mm to about 1 mm.

16. A beamsplitter according to claim 13, having a total transmittance of at least one of less than 5% and about 1%.

17. A beamsplitter according to claim 13, wherein the metallic layer is substantially opaque to light outside the holes.

18. A beamsplitter according to claim 13, wherein the metallic layer consists largely of aluminum.

19. A beamsplitter according to claim 13, wherein the metallic layer has a gradient of contaminants orthogonal to the lateral dimension, within which the contaminants lie close to the substrate supporting the metallic layer and a region close to a reflective surface of the metallic layer is substantially free of contaminants.

20. A beamsplitter according to claims 13, wherein a reflectance-enhancing dielectric coating is applied to the metallic coating.

21. A beamsplitter according to claim 13, wherein the reflective coating has a reflectance exceeding about 90% over a range of angles of incidence of at least 45±1°.

22. A beamsplitter according to claim 21, wherein the range of angles of incidence is at least 45±12°.

23. An illumination system for an optical device comprising a light source and a light exit, wherein at least one, geometric beamsplitter for coupling out a fraction of the light coming from the light source is arranged between the light source and the light exit, the geometric beamsplitter comprising:

a substrate fabricated from a transparent material;

a reflective coating that contains at least one metallic layer arranged on a surface of the substrate; and a pattern of holes comprising numerous transparent holes created in the reflective coating using laser processing.

24. An illumination device according to claim 23 comprising at least one energy sensor that is arranged with respect to the beamsplitter such that the energy sensor is capable of detecting the intensity of radiation transmitted by the beamsplitter.

25. A method for creating a beamsplitter having a prescribed nominal transmittance, comprising:

creating a distribution of holes such that the total transmittance of the beamsplitter is less than the nominal transmittance;

measuring the transmittance of the beamsplitter in order to determine an actual transmittance; and creating additional holes in order to increase the transmittance of the beamsplitter, depending upon the actual transmittance.

26. A method according to claim 25, wherein the additional holes are created according to a random distribution.

27. A method according to claim 25, wherein, subsequent to measuring the transmittance of the beamsplitter, a computation of the number of the additional holes to be added is performed, based on the difference between the nominal transmittance and the actual transmittance, wherein the addition of the additional holes depends upon the result of the computation.

28. A method according to claim 25 wherein the holes and the additional holes are created by laser processing.

* * * * *